United States Patent
Fan et al.

(10) Patent No.: US 9,851,393 B2
(45) Date of Patent: Dec. 26, 2017

(54) DETERMINATION OF FUSE LIFE IN A FUSE SYSTEM

(71) Applicant: GM GLOBAL TECHNOLOGY OPERATIONS LLC, Detroit, MI (US)

(72) Inventors: Yue Fan, Ann Arbor, MI (US); Salah Chamlal, Novi, MI (US); Shital Patel, Shelby Township, MI (US); Rashed S. Rabaa, West Bloomfield, MI (US); Andrew C. Baughman, Northville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 394 days.

(21) Appl. No.: 14/681,197

(22) Filed: Apr. 8, 2015

(65) Prior Publication Data

US 2016/0299186 A1    Oct. 13, 2016

(51) Int. Cl.
G01B 3/44         (2006.01)
G01R 31/07        (2006.01)

(52) U.S. Cl.
CPC .................................. *G01R 31/07* (2013.01)

(58) Field of Classification Search
None
See application file for complete search history.

(56) References Cited

U.S. PATENT DOCUMENTS

| 2010/0023284 A1* | 1/2010 | Rodseth | H01H 11/0062 702/60 |
| 2011/0291481 A1* | 12/2011 | Matsumoto | B60L 3/04 307/52 |
| 2012/0099235 A1* | 4/2012 | Jezierski | H02H 5/04 361/93.8 |
| 2013/0297142 A1* | 11/2013 | Geng | F01M 1/18 701/29.5 |
| 2014/0195179 A1* | 7/2014 | Guerin | G01R 19/16542 702/63 |
| 2016/0254661 A1* | 9/2016 | Matsumoto | B60R 16/033 361/31 |

FOREIGN PATENT DOCUMENTS

| JP | 2007043860 A | 2/2007 |
| JP | 2011120472 A | 6/2011 |
| WO | 2014083192 A1 | 6/2014 |

* cited by examiner

*Primary Examiner* — Shaun Campbell
(74) *Attorney, Agent, or Firm* — Quinn IP Law

(57) ABSTRACT

A fuse system includes a fuse element configured to receive a current. A controller is operatively connected to the fuse element and has a processor and tangible, non-transitory memory on which is recorded instructions for executing a method for determining a remaining fuse life ($L_R$) of the fuse element. Execution of the instructions by the processor causes the controller to determine a temperature (T) of the fuse element. The fuse system may be part of a vehicle. The controller may be configured to determine if the remaining fuse life is below first and second thresholds. If the remaining fuse life is above the second threshold, a first message may be displayed to a vehicle display. If the remaining fuse life is below the second threshold, the vehicle may be shifted to a predefined alternative operating mode.

13 Claims, 2 Drawing Sheets

DETERMINATION OF FUSE LIFE IN A FUSE SYSTEM

TECHNICAL FIELD

The disclosure relates generally to determination of fuse life for a fuse element, and more specifically, to determination of remaining fuse life in a vehicle.

BACKGROUND

Electric, hybrid, fuel cell and many other types of vehicles use battery packs as a source of electrical energy for driving the vehicles. These vehicles employ a fuse system to provide an automatic interruption of power in the event of excessive current flow.

SUMMARY

A fuse system includes a fuse element configured to receive a current. A controller is operatively connected to the fuse element and has a processor and tangible, non-transitory memory on which is recorded instructions for executing a method for determining a remaining fuse life (L) of the fuse element. Execution of the instructions by the processor causes the controller to determine at least one temperature (T) of the fuse element. The remaining fuse life (L) and temperature (T) vary over time t.

Determining the temperature (T) of the fuse element may include: determining the current (I) received by the fuse element; and converting the current (I) to the temperature (T), based at least partially on a resistance (R) and heat capacity ($C_P$) of the fuse element, an ambient temperature ($T_A$) and other factors.

One or more temperature sensors may be operatively connected to respective zones of the fuse element and configured to provide respective temperature readings for the respective zones. Determining the temperature (T) of the fuse element may include: obtaining the respective temperature readings from the one or more temperature sensors; and obtaining the temperature (T) of the fuse element as a weighted average of the respective temperature readings.

The controller may obtain multiple values of the temperature (T) and obtain a weighted value of the temperature (T), using respective weighting factors. The controller may be configured to convert the temperature (T) of the fuse element to a strain value (S). The controller may be configured to convert the strain value (S) to a used fuse life (U). The controller may be configured to convert the used fuse life (U) to the remaining fuse life (L).

The controller may be deactivated at an initial time from a first wake cycle and then activated after a key-off time duration ($t_0$) from the initial time. The controller may be configured to obtain a last-known temperature delta of the fuse element, where the last-known temperature delta is the last-known temperature difference from the first wake cycle between the fuse element and the ambient temperature. The controller may be configured to determine a correction factor (CF) based at least partially on the key-off time duration ($t_0$) and a predefined constant ($\tau$). The correction factor (CF) may be defined as the exponential of the negative of the key-off time duration ($t_0$) divided by a predefined constant ($\tau$) [$CF=e^{(-t_0/\tau)}$].

The fuse system may be part of a vehicle. The vehicle may include at least one battery component configured to store energy and be operatively connected to the fuse element. The controller may be configured to determine if the remaining fuse life is below a first threshold. If the remaining fuse life is below the first threshold, the controller determines if the remaining fuse life is below a second threshold. In one example, the first threshold is 20% life remaining and the second threshold is 5% life remaining.

If the remaining fuse life is above the second threshold (and below the first threshold), a first message may be displayed to the vehicle display. If the remaining fuse life is below the second threshold, the vehicle may be shifted to a predefined alternative operating mode. The predefined alternative operating mode is configured to limit the current received by the fuse element.

The above features and advantages and other features and advantages of the present disclosure are readily apparent from the following detailed description of the best modes for carrying out the disclosure when taken in connection with the accompanying drawings.

DETAILED DESCRIPTION

Figure 1:
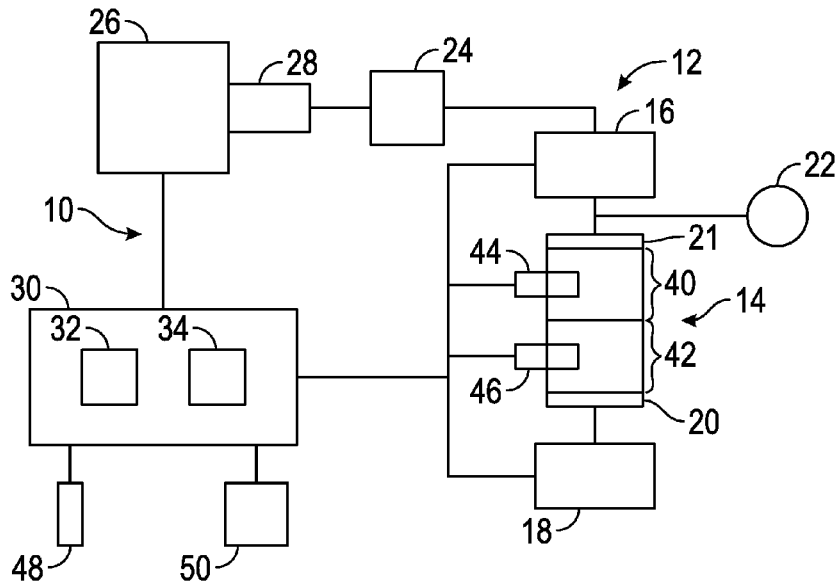
FIG. 1 is a schematic fragmentary view of a vehicle having a fuse element.

Referring to the Figures, wherein like reference numbers refer to the same or similar components throughout the several views, FIG. 1 shows a vehicle 10 having a battery system 12. The battery system 12 includes a fuse element 14 operatively connected to at least one battery component configured to store the electrical energy that may be used for operating the vehicle 10. In the embodiment shown, the fuse element 14 is operatively connected to first and second battery components 16, 18. However, it is to be understood that any number of battery components may be employed.

Referring to FIG. 1, the fuse element 14 may be mounted between electrical terminals 20, 21 and may be enclosed by a housing (not shown). The fuse element 14 may be arranged in series to carry all the current passing through the circuit. The current flow may be measured via a current-measuring device 22, such as an ammeter or other methods. In the embodiment shown, the resistance of the fuse element 14 generates heat due to the current flow. If current exceeding a predefined value flows, the fuse element 14 rises to a higher temperature and may directly melt, or indirectly melt another component, thereby opening the circuit. Any type of fuse element, employing any type of mechanism known to those of ordinary skill in the art, may be employed.

Referring to FIG. 1, the vehicle 10 may include a power converter assembly 24, an internal combustion engine 26 and an electric motor/generator 28. A controller 30 is operatively connected to the battery system 12 and various other components of the vehicle 10.

Referring to FIG. 1, the controller 30 has a processor 32 and tangible, non-transitory memory 34 on which are recorded instructions for executing a method 100, described below with reference to FIG. 2, for determining a remaining fuse life (L) of the fuse element 14. The controller 30 may be an integral portion of, or a separate module operatively} connected to, other control modules of the vehicle 10, such as the engine control module. The vehicle 10 may be any passenger or commercial automobile such as a hybrid electric vehicle, including a plug-in hybrid electric vehicle, an extended range electric vehicle, fuel cell or other vehicles. The vehicle 10 may take many different forms and include multiple and/or alternate components and facilities. While an example vehicle is shown in the Figures, the components illustrated in the Figures are not intended to be limiting. Indeed, additional or alternative components and/or implementations may be used.

The fuse element 14 may include one or more zones, each with a respective temperature sensor. In the embodiment shown in FIG. 1, the fuse element 14 includes first and second zones 40, 42, however, it is to be understood that any number of zones may be employed. A first zone temperature sensor 44 is operatively connected to the first zone 40 and configured to generate a first zone temperature signal ($T_{M1}$). A second zone temperature sensor 46 is operatively connected to the second zone 42 and configured to generate a second zone temperature ($T_{M2}$) signal. Referring to FIG. 1, an ambient temperature sensor 48 is operatively connected to the controller 30.

Figure 2:
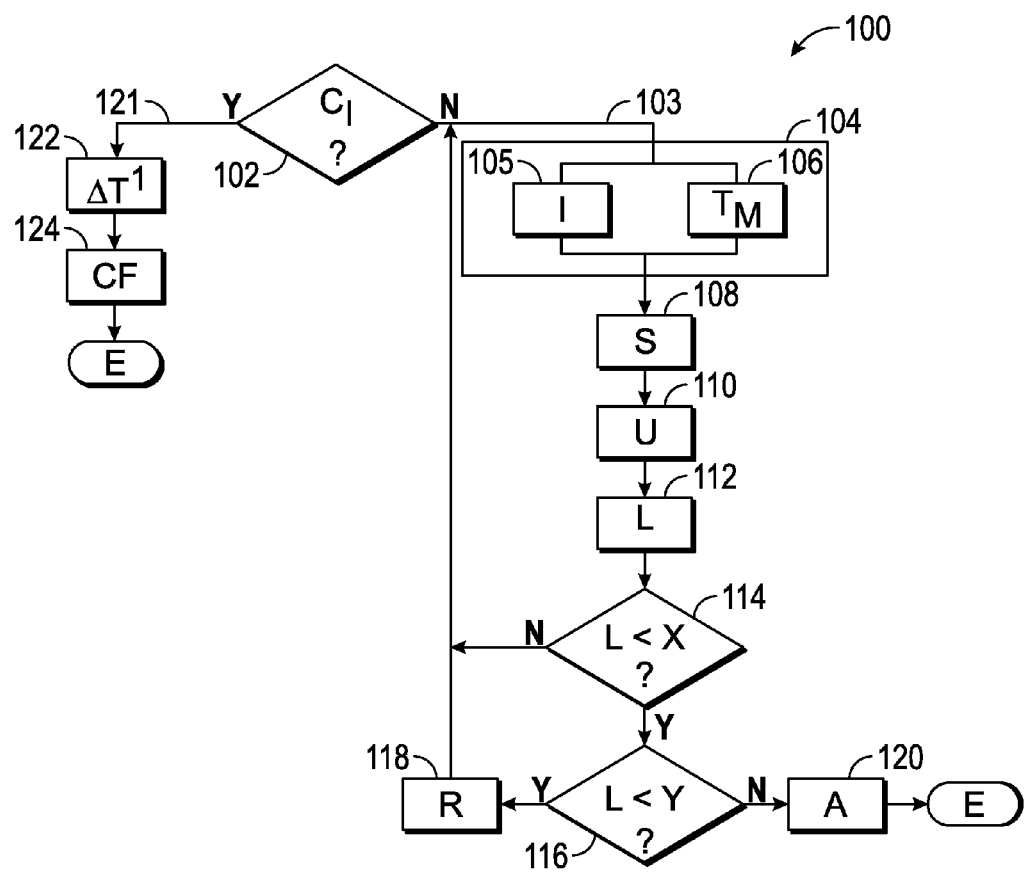
FIG. 2 is a flowchart for a method for determining a remaining fuse life of the fuse element of FIG. 1.

Referring now to FIG. 2, a flowchart of a method 100 stored on and executable by the controller 30 of FIG. 1 is shown. Method 100 is described below with reference to FIGS. 1-4. Method 100 is employed for determining the remaining fuse life (L) of the fuse element 14. Method 100 need not be applied in the specific order recited herein. In the figure, "Y" and "N" indicate "yes" and "no", respectively. Furthermore, it is to be understood that some steps may be eliminated.

Referring to FIG. 2, method 100 may begin with step 102 where the controller 30 determines if it is initializing (indicated in FIG. 2 as "$C_1$") or "waking up" after a controller sleep cycle. The method 100 may employ a retained state variable or flag to implement step 102, such that the flag is set as "true" at initialization, and otherwise set as "false." The controller 30 may be deactivated when the vehicle 10 is keyed off and may be initialized when the vehicle 10 is keyed on.

If the controller 30 is not initializing, the method 100 proceeds to step 104, as indicated by line 103. In step 104, the controller 30 is configured to determine the temperature (T) of the fuse element. Step 104 may be accomplished by sub-step 105 alone, sub-step 106 alone or a combination of sub-steps 105 and 106.

Sub-step 105 includes determining the current (I) received by the fuse element 14 via the current-measuring device and then converting the current (I) to the temperature (T). The current (I) is converted to the temperature (T) based at least partially on a resistance (R) and heat capacity ($C_P$) of the fuse element 14, a last-known temperature ($T_L$), a heat transfer coefficient k and an ambient temperature ($T_A$). In one embodiment, the temperature (T) is defined as:

$$T(t)=\int_0^t (I^2(t)*R-k(T_L-T_A))dt/C_P.$$

Here, k represents a heat transfer coefficient for calculating heat lost to the ambient temperature. The heat transfer coefficient k may be generated for a particular system using calculations or a lookup table. In one example, the heat transfer coefficient k is assumed to be a constant and calculated based on the vertical and horizontal surface area of the fuse element 14, the general shape of the housing (not shown) that the fuse element 14 resides in, the surface temperature of the fuse element 14 and other factors. The fuse element 14 may be broken down into multiple surfaces each having its own surface temperature and heat transfer coefficient. In another example, the heat transfer coefficient k is assumed to vary based on the degree of temperature difference between the surface temperature of the fuse element 14 and ambient temperature ($T_A$). In this case, the heat transfer coefficient k may be in the form of a lookup table or in the form of an equation. The method 100 may include multiple heat transfer coefficients in the temperature approximation, such as a heat transfer coefficient that is applied to the fuse body temperature instead of directly on the fuse element 14. Additional coefficients may be applied directly to the fuse element 14 in order to approximate heat flowing from the elements into the material that is used to fill the void between the elements and into the fuse body/copper cables (not shown).

Referring to FIG. 2, sub-step 106 includes obtaining the respective temperature readings ($T_{M1}$, $T_{M2}$) from the first and second zones 40, 42 (through temperature sensors 44, 46); and obtaining the temperature (T) of the fuse element 14 as a weighted average of the respective temperature readings with respective weighting factors ($V_1$, $V_2$), such that $[T=V_1*T_{M1}+V_2*T_{M2}]$. As noted above, the fuse element 14 may include any number of zones and corresponding temperature sensors.

Figure 3:
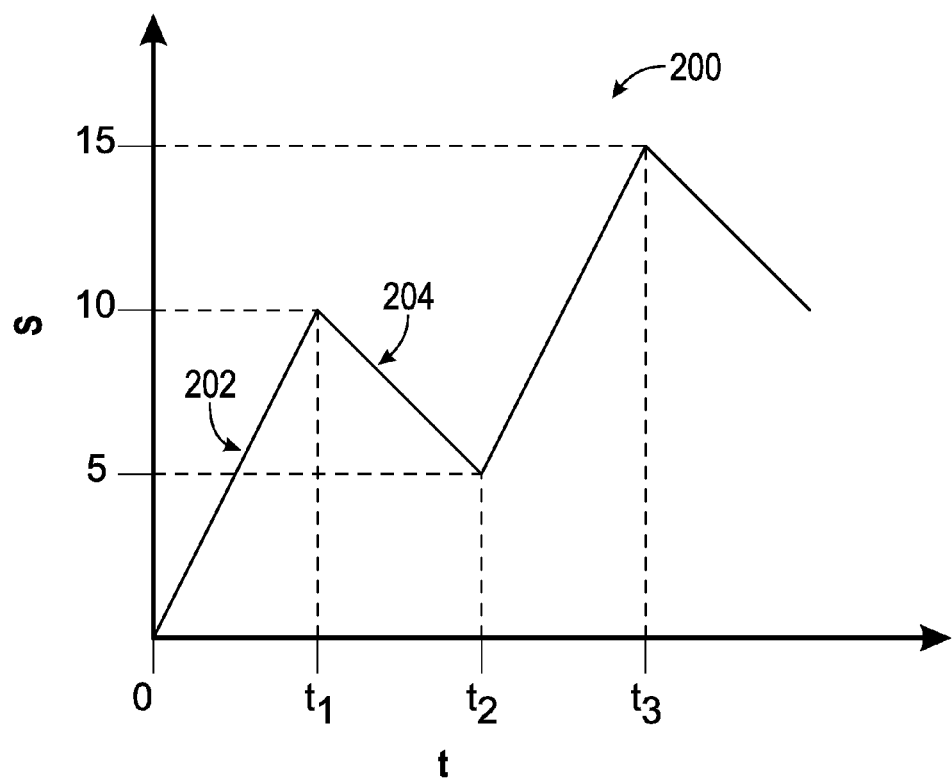
FIG. 3 is one example of a graph that may be employed in the method of FIG. 2, showing strain values in the y-axis versus time in the x-axis.

The controller 30 may obtain repeat step 104 to obtain multiple values of the temperature and use a weighted value (obtained with respective weighting factors) of the temperature (T) in step 108. In one example, the controller 30 repeats step 104 twice and uses the average value of the temperature (T=0.5 $T_1$+0.5 $T_2$) in step 108, providing a more robust determination. In step 108 of FIG. 2, the controller 30 is configured to convert the temperature (T) of the fuse element to a strain value (S). The controller 30 may employ a temperature-to-strain look-up table to convert the temperature value (T) to the strain value (S). The temperature-to-strain table may be created for a particular fuse element 14 by employing finite element analysis and the physical properties of the materials within the fuse element 14. FIG. 3 illustrates an example of a graph 200 displaying strain values over time for the fuse element 14. The x-axis in FIG. 3 represents time (t) and the y-axis represents strain values (S). Portion 202 represents a heating cycle while portion 204 represents a cooling cycle. Referring to FIG. 3, at times $t_1$, $t_2$ and $t_3$, the strain values may be 10%, 5% and 15%, respectively. The numbers depicted in FIGS. 3-4 were selected for illustration purposes.

In step 110 of FIG. 2, the controller 30 is configured to convert the strain value (S) to a used fuse life (U). The used fuse life [U(t)] may be defined as the percentage of the fuse life used up at time t; thus the used fuse life is zero at time t=0 (U(0)=0). The controller 30 may employ a look-up table, equations, a strain-life graph or a combination of these and other elements to convert the strain value to the used fuse life. Other methods may be used.

Figure 4:
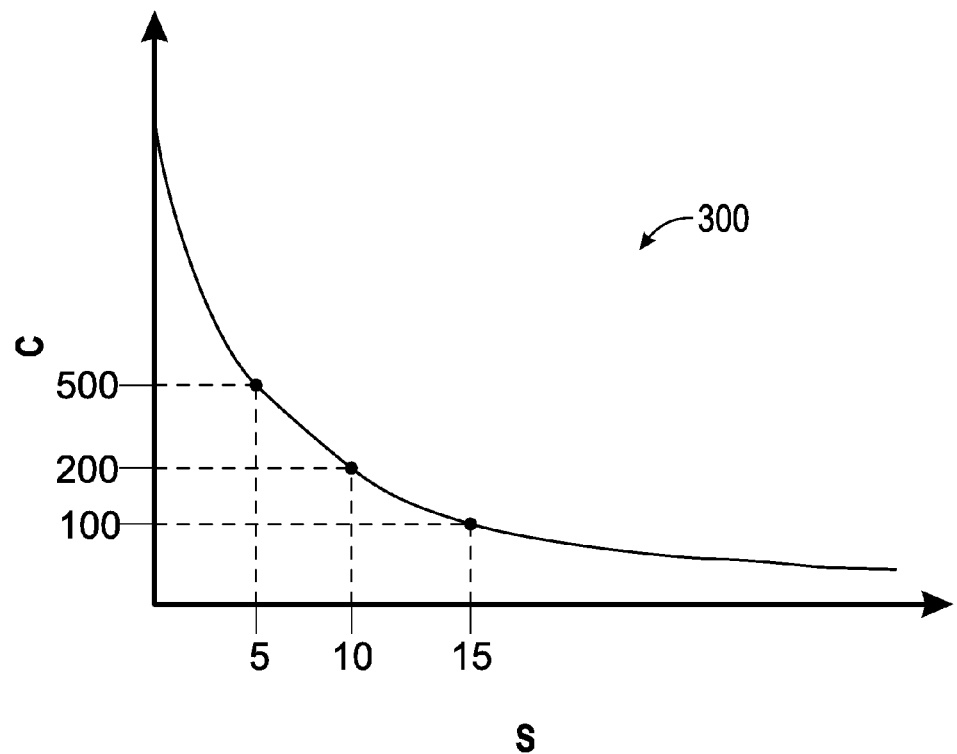
FIG. 4 is one example of a graph that may be employed in the method of FIG. 2, showing cycles to failure in the y-axis versus strain values in the x-axis.

FIG. 4 illustrates an example of a strain life graph 300 that may be employed in step 110. The x-axis in FIG. 4 represents strain value (S) and the y-axis represents cycles to failure (C). Referring to FIG. 4, strain values of 5%, 10% and 15% correspond to 500, 200 and 100 cycles to failure, respectively. The strain life graph may be generated for a particular fuse type in a test environment by having a representative sample undergo repeated strain loading amplitudes until it fails. The representative sample may be selected to have the same composition, the same heat treatment, the same phases(s), and the same formation techniques as the fuse element 14. The temperature of the sample may be varied.

The used fuse life (U) at time ($t_n$) may be defined as the absolute value of the difference in inverse cycles to failure values at times ($t_n$) and ($t_{n-1}$) (illustrated in the example below):

$$U(t_n)=|1/C(t_n)-1/C(t_{n-1})|.$$

In step 112 of FIG. 2, the controller 30 is configured to convert the used fuse life (U) to the remaining fuse life (L). The remaining fuse life [L(t)] may be defined as the percentage of the fuse life remaining at time t. The remaining fuse life (L) at time ($t_n$) may be defined as (illustrated in the example below):

$$L(t_n)=L(t_{n-1})-U(t_n).$$

A numerical non-limiting example based on FIGS. 3-4 is presented here. As noted above with respect to FIG. 3, at times $t_1$, $t_2$ and $t_3$, the strain values are 10%, 5% and 15%, respectively. As noted above with respect to FIG. 4, strain values of 5%, 10% and 15% correspond to 500, 200 and 100 cycles to failure, respectively. The used fuse life and remaining fuse life at time $t_1$ may be calculated as follows:

$$U(t_1)=|1/C(10\% \text{ strain})|=(1/(200 \text{ cycles to failure})$$
$$=0.5\%.$$

$$L(t_1)=L(t_0)-U(t_1)=100\%-0.5\%=99.5\%$$

The used fuse life and remaining fuse life at time $t_2$ may be calculated as follows:

$$U(t_2)=|1/C(5\% \text{ strain})-1/C(10\% \text{ strain})|=|1/(500 \text{ cycles to failure})-1/(200 \text{ cycles to failure})|$$
$$=|0.2\%-0.5\%)|=0.3\%.$$

$$L(t_2)=L(t_1)-U(t_2)=99.5\%-0.3\%=99.2\%$$

The used fuse life and remaining fuse life at time $t_3$ may be calculated as follows:

$$U(t_3)=|1/C(15\% \text{ strain})-1/C(5\% \text{ strain})|=|1/(100 \text{ cycles to failure})-1/(500 \text{ cycles to failure})|$$
$$=|1\%-0.2\%)|=0.8\%.$$

$$L(t_3)=L(t_2)-U(t_3)=99.2\%-0.8\%=98.4\%.$$

In step 114, the controller 30 is configured to determine if the remaining fuse life is below a first threshold (L<X). In one example, the first threshold is 20% life remaining. If the remaining fuse life (L) is below the first threshold, the method 100 proceeds to step 116. If the remaining fuse life (L) is above the first threshold, the method 100 may loop back to step 104.

In step 116 of FIG. 2, the controller 30 is configured to determine if the remaining fuse life is below a second threshold (L<Y). In one example, the second threshold is 5% life remaining. If the remaining fuse life (L) is above the second threshold, method 100 proceeds to step 118 in which the controller 30 is configured to display a first message or reminder (indicated as "R" in FIG. 2) to a vehicle display 50, shown in FIG. 1, communicating that the remaining fuse life (L) is below a certain level. The vehicle display 50 may be a driver information center in the instrument panel (not shown), which may include a fuse reminder icon that lights up. The vehicle display 50 may be a screen on the instrument panel (not shown). The vehicle display 50 may be a heads-up display reflected off a windshield (not shown) of the vehicle 10 (not shown). Additionally, the first message may include a voice alert and/or an audible chime. The method 100 may loop back to step 104 from step 118.

If the remaining fuse life is below the second threshold, method 100 proceeds to step 120 in which the controller 30 is configured to shift to a predefined alternative operating mode (indicated as "A" in FIG. 2). The predefined alternative operating mode is configured to limit the current received by the fuse element 14. This prevents stressing of the fuse element 14. Thus, the predefined alternative operating mode may prevent high acceleration of the vehicle 10.

The remaining fuse life (L) may be converted to a mileage counter that is specific to a particular vehicle/driver, e.g miles remaining fuse life (M). For example, if 50% remaining fuse life (L=50%) occurred for a first vehicle/driver at an odometer reading of 10,000 miles, this would indicate that the first vehicle/driver A had 10,000 miles left in remaining fuse life (M=10,000 miles). If 50% remaining fuse life (L=50%) occurred for a second vehicle/driver at an odometer reading of 20,000 miles, this would indicate that the second vehicle/driver had 20,000 miles left in remaining fuse life (M=20,000 miles).

Referring back to step 102, if the controller 30 is initializing, the method 100 may proceed to step 122, as indicated by line 121. In step 122 of FIG. 2, the controller 30 is configured to obtain the last-known temperature delta ($\Delta T^1$) of the fuse element 14, i.e., the last calculated or known temperature difference between the fuse element 14 and the surrounding ambient temperature from the previous wake cycle of the controller 30. When the controller goes to sleep or is deactivated, the temperature difference between the fuse element 14 and the surrounding ambient temperature is retained across the sleep cycle in order to calculate how much heat to reject on the next controller wake cycle.

In step 124 of FIG. 2, the controller 30 is configured to determine a correction factor (CF) that accounts for heat loss of the fuse element 14 during the sleep cycle of the controller 30. The controller 30 is deactivated when the vehicle 10 is keyed off and initialized when the vehicle 10 is keyed on. However, the fuse element 14 continues to reject heat out to the ambient temperature during the sleep cycle, thus a correction factor (CF) is needed to account for this heat loss. The rate of heat loss is proportional to the difference in temperature between the fuse element 14 and the surrounding ambient temperature, referred to herein as the "temperature delta." The temperature delta ($\Delta T=T_L-T_A$) is employed in substep 105 above in converting the current (I) to the temperature (T). The temperature (T) obtained in each cycle of step 104 of FIG. 2 may be stored as the last-known temperature ($T_L$).

The corrected temperature delta ($\Delta T$) of the fuse element 14 is defined as a product of the last-known temperature delta ($\Delta T^1$) of the fuse element 14 multiplied by the correction factor (CF). The correction factor (CF) is based at least partially on the key-off time duration ($t_0$) and a predefined constant ($\tau$). In the embodiment shown, the correction factor (CF) is defined as the exponential of the negative of the key-off time duration ($t_0$) divided by a predefined constant ($\tau$) [$CF=e^{(-t0/\tau)}$], where e is Euler's number. Thus the corrected temperature delta ($\Delta T$) may be defined as (where $T_L^1$ is the uncorrected last-known temperature and $T_A^1$ is the uncorrected ambient temperature):

$$(\Delta T)=(\Delta T^1)*CF=(T_L^1-T_A^1)*e^{(-t0/\tau)}.$$

The time constant to may be calculated by measuring the temperature decay of the fuse element 14 after key-off and fitting the function [$e^{(-t0/\tau)}$] to the measured results. In another example, the time constant to is calculated using the thermal capacity, thermal resistivity, surface area, and heat transfer coefficient to calculate an approximate temperature in lieu of physical temperature measurements. Alternatively, the time constant to may be calculated by employing thermal and/or computational fluid dynamics 2D/3D simulations in lieu of physical temperature measurements.

As noted above, the controller 30 of FIG. 1 may include a computing device that employs an operating system or processor 32 and memory 34 for storing and executing computer-executable instructions. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor 32 (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

The invention claimed is:

1. A vehicle comprising:
at least one battery component configured to store energy, the vehicle being at least partially an electric vehicle;
a fuse element operatively connected to the at least one battery component and configured to receive a current;
a controller operatively connected to the fuse element and having a processor and tangible, non-transitory memory on which is recorded instructions for executing a method for determining a remaining fuse life of the fuse element;
wherein the controller is deactivated at an initial time from a first wake cycle and then activated after a key-off time duration (to) from the initial time, execution of the instructions by the processor causing the controller to:
determine at least one temperature (T) of the fuse element, the remaining fuse life being based in part on the at least one temperature (T);
obtain a last-known temperature delta of the fuse element, the last-known temperature delta being a last-known temperature difference from the first wake cycle between the fuse element and an ambient temperature ($T_A$);
determine a correction factor based in part on the key-off time duration ($t_0$) and a predefined constant ($\tau$);
obtain a corrected temperature delta ($\Delta T$) as a product of the correction factor and the last-known temperature delta, the at least one temperature (T) being based in part on the corrected temperature delta ($\Delta T$); and
control operation of the vehicle based on a magnitude of the remaining fuse life, including limiting the current received by the fuse element if the remaining fuse life is below a second threshold.

2. The vehicle of claim 1, wherein the fuse element defines a resistance (R) and a heat capacity ($C_P$), and wherein said determining at least one temperature (T) of the fuse element includes:
determining the current (I) received by the fuse element; and
converting the current (I) to the temperature (T), based at least partially on the resistance (R) of the fuse element, a heat transfer coefficient (k), the corrected temperature delta ($\Delta T$) and the heat capacity ($C_P$) of the fuse element.

3. The vehicle of claim 1, further comprising:
one or more temperature sensors operatively connected to respective zones of the fuse element and configured to provide respective temperature readings for the respective zones;
wherein said determining at least one temperature (T) of the fuse element includes:
obtaining the respective temperature readings from the one or more temperature sensors;
obtaining the temperature (T) of the fuse element as a weighted average of the respective temperature readings.

4. The vehicle of claim 1, wherein the correction factor (CF) is defined as the exponential of the negative of the key-off time duration ($t_0$) divided by a predefined constant ($\tau$) (CF=$e^{(-t0/\tau)}$).

5. The vehicle of claim 1, wherein the controller is configured to convert the at least one temperature (T) of the fuse element to a strain value (S).

6. The vehicle of claim 5, wherein the controller is configured to:
convert the strain value (S) to a used fuse life (U); and
convert the used fuse life (U) to the remaining fuse life (L).

7. The vehicle of claim 1, further comprising a vehicle display and wherein execution of the instructions by the processor further causes the controller to:
determine if the remaining fuse life is below a first threshold;
if the remaining fuse life is below the first threshold, determine if the remaining fuse life is below the second threshold, the second threshold being less than the first threshold; and
if the remaining fuse life is above the second threshold, display a first message on the display.

8. The vehicle of claim 7, wherein the first threshold is 20% life remaining and the second threshold is 5% life remaining.

9. A method for determining a remaining fuse life for a fuse element in a vehicle having a controller, the vehicle being at least partially an electric vehicle, the method comprising:
obtaining a current (I) received by the fuse element via a current-measuring device;
determining at least one temperature (T) of the fuse element based at least partially on the current (I), via the controller, the remaining fuse life being based in part on the at least one temperature (T);
wherein the controller is deactivated at an initial time from a first wake cycle and then activated after a key-off time duration ($t_0$) from the initial time;
obtaining a last-known temperature delta of the fuse element, the last-known temperature delta being a last-known temperature difference from the first wake cycle between the fuse element and an ambient temperature ($T_A$);
determining a correction factor based in part on the key-off time duration ($t_0$) and a predefined constant ($\tau$);
obtaining a corrected temperature delta ($\Delta T$) as a product of the correction factor and the last-known temperature delta, the at least one temperature (T) being based in part on the corrected temperature delta ($\Delta T$); and
controlling operation of the vehicle based on a magnitude of the remaining fuse life, including limiting the current received by the fuse element if the remaining fuse life is below a second threshold.

10. The method of claim 9, wherein the vehicle includes a display and further comprising:
determining if the remaining fuse life is below a first threshold;
if the remaining fuse life is below the first threshold, determining if the remaining fuse life is below the second threshold, via a controller, the second threshold being less than the first threshold.

11. The method of claim 9, further comprising converting, via the controller:
the temperature (T) of the fuse element to a strain value (S);
the strain value (S) to a used fuse life (U); and
the used fuse life (U) to the remaining fuse life.

12. The method of claim 9, wherein said determining at least one temperature (T) of the fuse element includes:
determining the at least one temperature (T) based in part on the current (I) received by the fuse element over a time (t), a resistance (R) of the fuse element, a heat transfer coefficient (k), the corrected temperature delta ($\Delta T$) and a heat capacity ($C_P$) of the fuse element such that:

$T(t) = \int_0^t (I^2(t)*R - (k*\Delta T)/C_P) dt.$

13. The vehicle of claim 1, wherein the controller is configured to:
determine the at least one temperature (T) of the fuse element based in part on the current (I) received by the fuse element over a time (t), a resistance (R) of the fuse element, a heat transfer coefficient (k), the corrected temperature delta ($\Delta T$) and a heat capacity ($C_P$) of the fuse element such that:

$T(t) = \int_0^t (I^2(t)*R - (k*\Delta T)/C_P) dt.$

* * * * *

UNITED STATES PATENT AND TRADEMARK OFFICE
CERTIFICATE OF CORRECTION

| | | |
|---|---|---|
| PATENT NO. | : 9,851,393 B2 | Page 1 of 1 |
| APPLICATION NO. | : 14/681197 | |
| DATED | : December 26, 2017 | |
| INVENTOR(S) | : Yue Fan et al. | |

It is certified that error appears in the above-identified patent and that said Letters Patent is hereby corrected as shown below:

In the Claims

Column 10, Line 16, in Claim 10, "being less than the first threshold." should read --being less than the first threshold; and if the remaining fuse life is above the second threshold, displaying a first message on the display.--

Signed and Sealed this
Tenth Day of July, 2018

Andrei Iancu
*Director of the United States Patent and Trademark Office*